United States Patent
Grimme et al.

(10) Patent No.: US 8,085,043 B2
(45) Date of Patent: Dec. 27, 2011

(54) METHOD FOR IMAGE DATA ACQUISITION WITH A MAGNETIC RESONANCE DEVICE

(75) Inventors: Andreas Grimme, Erlangen (DE); Jens Guehring, Monmouth Junction, NJ (US); Marie-Pierre Jolly, Hillsborough, NJ (US); Michaela Schmidt, Uttenreuth (DE); Peter Speier, Erlangen (DE)

(73) Assignees: Siemens Aktiengesellschaft, Munich (DE); Siemens Corporate Research, Inc., Princeton, NJ (US)

( * ) Notice: Subject to any disclaimer, the term of this patent is extended or adjusted under 35 U.S.C. 154(b) by 250 days.

(21) Appl. No.: 12/417,782

(22) Filed: Apr. 3, 2009

(65) Prior Publication Data

US 2010/0253335 A1    Oct. 7, 2010

(51) Int. Cl.
*G01V 3/00* (2006.01)
(52) U.S. Cl. .................. 324/309; 324/307; 324/306
(58) Field of Classification Search .......... 324/300–322; 600/407–434; 382/128–131
See application file for complete search history.

(56) References Cited

U.S. PATENT DOCUMENTS

| | | | |
|---|---|---|---|
| 5,390,258 A * | 2/1995 | Levin | 382/131 |
| 5,546,472 A * | 8/1996 | Levin | 382/131 |
| 6,249,594 B1 * | 6/2001 | Hibbard | 382/128 |
| 6,700,374 B1 * | 3/2004 | Wu et al. | 324/312 |
| 6,717,406 B2 * | 4/2004 | Sodickson | 324/307 |
| 6,965,232 B2 * | 11/2005 | Sodickson | 324/307 |
| 7,714,576 B2 * | 5/2010 | Van Den Brink et al. | 324/318 |
| 7,800,368 B2 * | 9/2010 | Vaughan et al. | 324/318 |
| 7,817,836 B2 * | 10/2010 | Chao et al. | 382/131 |
| 2002/0158632 A1 * | 10/2002 | Sodickson | 324/307 |
| 2004/0155652 A1 * | 8/2004 | Sodickson | 324/307 |
| 2007/0280521 A1 * | 12/2007 | Chao et al. | 382/131 |
| 2008/0129298 A1 * | 6/2008 | Vaughan et al. | 324/322 |
| 2008/0303519 A1 * | 12/2008 | Van Den Brink et al. | 324/307 |
| 2010/0253335 A1 * | 10/2010 | Grimme et al. | 324/309 |

* cited by examiner

*Primary Examiner* — Melissa Koval
*Assistant Examiner* — Tiffany Fetzner
(74) *Attorney, Agent, or Firm* — Schiff Hardin LLP

(57) ABSTRACT

In a method for image data acquisition of a region of interest in a subject with a magnetic resonance device, wherein, to establish the field of view, a minimal geometric shape encompassing the subject to be acquired and/or the surface of the subject is determined automatically from previously acquired localizer exposures as aliasing information for each exposure, at least one slice plane is determined for the acquisition of the region, and the phase coding direction and/or the extent of the field of view in the phase coding direction is determined for every slice plane using the aliasing information.

23 Claims, 4 Drawing Sheets

METHOD FOR IMAGE DATA ACQUISITION WITH A MAGNETIC RESONANCE DEVICE

BACKGROUND OF THE INVENTION

1. Field of the Invention

The present invention concerns a method for image data acquisition of a region of interest in a subject with a magnetic resonance device.

2. Description of the Prior Art

In the acquisition of image data with a magnetic resonance device, a number of artifacts are known that can occur when the image acquisition parameters are not ideally selected. In particular, an artifact known as aliasing can occur with regard to the determination of a field of view (FoV). This occurs when a field of view was selected in the phase coding direction so that a portion of the subject to be acquired (for example a patient body) is arranged outside of the field of view. Such artifacts can occur in the partition direction even if no slice selection pulse is used, but is barely possible in practice. The field of view in the phase coding direction (and possibly in the partition direction) is accordingly not selected based on the diagnostic requirements, but is instead set so that the requirements of k-space scanning are satisfied.

To solve this problem, it is known to select the field of view so large in principle that every conceivable subject to be acquired in the phase coding direction is completely encompassed by the field of view. The field of view is frequently manually determined, and an experienced user can estimate how the aliasing artifacts might appear and whether the region of interest is also safely free of aliasing. Uncertainties and consequently measurements of images with aliasing in regions to be diagnosed can occur in the case of less well-trained personnel or less experienced personnel, such that the image acquisitions must be repeated.

Due to the manual selection of the field of view, in the known methods it is additionally typical to select this field of view for only one slice of a measurement protocol, and then to apply it to all slices so that ultimately a field of view is created that is dimensioned larger for most slices, without this being necessary. This therefore leads to the situation that the user is not expected to input the field of view for every single slice (in particular in the phase coding direction) nor the position in the slice plane.

In the procedure that is typical today, a user accordingly defines the field of view manually for each examination step. In the event that the field of view is selected smaller than the subject and aliasing is to be anticipated, for the most part it is ensured using a test measurement that the region of interest (in particular an organ to be depicted) is free of aliasing. These test measurements are repeated until the desired goal is achieved. This is time-consuming and requires the acquisition of a plurality of additional measurement data.

In the methods available today, it is not possible for the user to adapt the field of view of a slice stack or of all slice planes of a protocol individually. Although isolated measurements are known in which slices are measured with a different field of view in different protocols, such a procedure significantly lengthens the examination, in particular when these are measurements in which a patient must hold his breath.

SUMMARY OF THE INVENTION

An object of the present invention is to provide a method with which the field of view can be established (in particular in the phase coding direction) so that the region of interest is free of aliasing and the field of view is optimally small.

This object is achieved in accordance with the invention by a method for image data acquisition of a region of interest in a subject with a magnetic resonance device, wherein to establish the field of view, a minimal geometric shape encompassing the subject to be acquired and/or the surface of the subject is determined automatically from previously acquired localizer exposures as aliasing information for each exposure, at least one slice plane is determined for the acquisition of the region and the phase coding direction and/or the extent of the field of view in the phase coding direction is determined for every slice plane using the aliasing information.

The basis of this method is thus to supply the system (for an automatic selection) or the user (for a manual selection) with patient-dependent prior information in order to enable a determination of the field of view to be made as optimally as possible, in particular with regard to the phase coding direction and/or the extent of the field of view in the phase coding direction. According to the invention, the localizer exposures that are acquired anyway in the typical workflow in magnetic resonance devices are used in order to obtain aliasing information, ultimately information about the extent of the subject at least in the area of the region of interest. A geometric shape is approximated as closely as possible to the surface of the subject that is visible in the localizer exposures while taking into account specific minimization criteria, or to determine the surface of the subject as optimally as possible and process this further if necessary. This aliasing information can be used in order to determine how far aliasing occurs in specific directions in specific dimensions of the field of view, which information can advantageously be used for assistance in the manual input of a field of view or even for automatic determination of the field of view. An improved (in particular smaller) field of view which entails a whole series of advantages is consequently defined via the method according to the invention, even in the phase coding direction. It is thus possible for the measurements to be significantly accelerated, but this gained measurement time can alternatively be "given up" in order to achieve a higher resolution or a better signal-to-noise ratio. In addition, the resolution in the image acquisition is adapted using the size of the field of view, in particular a maximum size of a field of view. With the method according to the invention, it is thus possible to determine an individual field of view for every slice plane given multiple slice planes. A slice plane-dependent field of view that is optimized in all of these slice planes represents an additional improvement and likewise leads to an acceleration of the measurements or even to a possible improvement of the image quality. The advantage gained by the improved field of view per slice plane thus can be realized in image quality, both for acceleration of the measurement and for a maintained measurement time, wherein an increased signal-to-noise ratio can be obtained.

As described above, an optimal basis of the aliasing information is the minimal geometric shape encompassing the subject to be acquired. This geometric shape can be a rectangle, for example. This rectangle is placed in the slice plane of the directly observed localizer exposure and is minimized. For example, for this purpose the area of the rectangle and/or a side length is minimized. In particular when a phase coding direction is definitely predetermined (for example by a measurement protocol), a side length of the rectangle can be selected that runs precisely in the phase coding direction. The rectangle is then selected so that precisely this side length is minimal without an overlap arising between the rectangle and the imaged subject. In such a case, at this point the acquisition is already optimized with regard to aliasing. Naturally, it is also possible to use other geometric shapes (such as ellipses or the like) given which the semi-minor axis can lie in the direction of a predetermined phase coding direction, for example. However, given a phase coding direction that is not predetermined it can also be reasonable to search for a shortest dimension of the geometric shape, such that this can lie in any direction. This direction can then be selected as a phase coding direction, for example.

It should again be noted that, in the event that three-dimensional image acquisitions should be executed and aliasing can also occur in the partition direction, the extent of the field of view in the partition direction can naturally also be determined in the method according to the invention using the aliasing information.

In magnetic resonance examinations it can occur that the manually or automatically determined slice planes of the actual image acquisition do not coincide with those of the localizer exposures; slice planes deviating from the planes of the localizer exposures thus occur. In such a case, the shape in the slice plane is determined from the specific shapes. This can in particular occur by interpolation.

However, with the method according to the invention it is also possible to determine the surface of the subject from the localizer exposures. For example, a segmentation method as it is already known in multiple ways from the prior art can be used for this. In the following a three-dimensional model describing the surface of the subject can be determined from the surfaces of the subject determined for the localizer exposures, which three-dimensional model serves in the following as aliasing information and in which the surface of the subject can be determined for each selected slice plane. As in the interpolation of shapes, it is thereby assumed that the surface of the subject is smooth.

In the framework of the method according to the invention, there are multiple possibilities to select the at least one slice plane. It can thus be provided that the at least one slice plane is determined by a user. This can in particular ensue using a marking tool in a localizer exposure or a representation derived from the localizer exposures. Alternatively, it is naturally also possible for the slice plane to be automatically determined. A sufficiently good or optimized selection for the slice planes can be made under specification of the examination goal (thus the region of interest), for example when an anatomical atlas exists with which the localizer exposures can be registered. A semi-automatic method is also achieved, such that a user selects one slice plane and the remaining slice planes are automatically derived from this definition, for example. Finally, it is also possible that the at least one slice plane is predetermined by a measurement protocol. In such a measurement protocol, optimized image acquisition parameters from preceding measurements of the same type are ultimately transferred to the current image acquisition. In such measurement protocols, for example, a number of the parameters determining the field of view can also be definitely predetermined.

Two basic embodiments of the method according to the invention are described with regard to the ultimate determination of the phase coding direction and/or the extent of the field of view in the phase coding direction. The determination of the field of view (thus in particular also the phase coding direction and/or the extent of the field of view in the phase coding direction) can ensue manually, with the user being assisted in the selection, based on the aliasing information. For example, for this purpose the user marks one possible field of view in a representation (in particular a localizer exposure or a representation derived from the localizer exposures) to determine the phase coding direction and/or the extent of the field of view in the phase coding direction, whereupon the occurring aliasing is automatically determined under consideration of the aliasing information and is presented to the user. In this embodiment of the method according to the invention, after marking a possible field of view the user can thus immediately view how far the aliasing would spread in an image acquired with this possible field of view. Ideally, a representation of the subject in the directly observed slice plane is thereby used as a representation. The field of view determined based on the aliasing information can then likewise be displayed via cross-fades or colorations, for example. In this way the selection of the field of view (in particular of the phase coding direction and/or the extent of the same) is no longer based only on the level of experience or the level of training of the user, such that fewer image exposures without diagnostic value are created, and in particular test measurements are also no longer necessary.

In a further embodiment of the method according to the invention, however, it is not necessary for the user to have to mark the field of view in a representation. In this largely automated second embodiment of the method according to the invention, an aliasing-free, desired area (in particular encompassing the region) is selected to determine the phase coding direction and/or the extent of the field of view in the phase coding direction, whereupon the phase coding direction and/or the extent of the field of view in the phase coding direction is automatically determined from this area under consideration of the aliasing information. The method according to the invention thus does not require the details of k-space scanning to be used in an automatic determination based on the aliasing information (as was conventional), and thus allows a more intuitive focus to be made on the diagnostically useful region that is ultimately also to be determined. Given a manual or semi-automatic embodiment, the user must accordingly merely decide which area should be free of aliasing in this case, without having to be concerned about these artifacts and the underlying physics. The method is accordingly designed more simply and intuitively in this way.

For example, in a manual version the user marks the minimal, aliasing-free area on which the examination depends in a representation of a localizer exposure or a representation derived from the localizer exposures (in particular a representation of the slice plane). This is typically the region of interest, in particular an organ to be examined, but it may possibly circumscribe this organ, for example with a safety interval. A freehand marking thus can be made, or a geometric model with a few parameters (for example one ellipse including the heart) can be adapted. In a semi-automatic variant, a computer-aided selection of area can also ensue, for example in that starting points for a segmentation are predetermined.

Naturally, it is also possible that the region of interest is automatically found, for example by means of a segmentation method and/or assisted by an anatomical atlas from which the area can likewise be automatically determined. For example, a safety interval or the like can thereby be selected. At this point it is already noted that the area can naturally generally also be used in order to be able to automatically determine the remaining parameters describing the field of view, in particular the position of the field of view in the slice plane and/or the extent of the field of view in the readout direction and/or the extent of the field of view in a partition direction. An embodiment of the method according to the invention is thus conceivable via which the slice planes and the field of view can be automatically, entirely determined merely via specification of the region of interest (for example heart examination or the like), according to which the magnetic resonance device is correspondingly controlled with these parameters for image acquisition.

The phase coding direction is determined, in this second embodiment of the method according to the invention, for example, by using the shortest and/or a short interval of two boundaries of the geometric shape or the surface of the subject in the slice plane, which boundaries include the area. This shortest extent of the subject that is to be selected also allows the field of view to be minimized in this direction. At this point it is noted that the phase coding direction can also be defined using the parameter of the rotation in the slice plane.

In order to automatically determine the extent of the field of view in the phase coding direction, in a first rough approximation it can be provided that it is determined as a maximum distance between the boundaries of the geometric shape or the surface of the subject in the slice plane in the phase coding direction over an extent in the readout direction. In this way it is already possible to optimize the field of view, in particular when the field of view is individually determined for each slice plane. Nevertheless, no aliasing whatsoever occurs in this variant since all perpendiculars to the readout direction that lie in the readout direction field of view are considered, and the maximum of the extent of the subject is selected as an extent of the field of view in the phase coding direction in this slice plane. The extent in the readout direction thereby results from the dimensions of the area. As mentioned, corresponding advantages can already be established in this embodiment.

Alternatively, it is possible to determine the extent of the field of view in the phase coding direction so that the area or the area and a predetermined border surrounding the area are free of aliasing. The extent in the phase coding direction is accordingly modified (for example in a minimization method) and, using the aliasing information, it is checked whether aliasing would occur in the area given an image acquisition. The smallest extent is then selected in which no aliasing protrudes into the area. The smallest possible extent in the phase coding direction is always selected in this way, such that is a particularly advantageous embodiment. In this context it can be reasonable to also keep a certain border around the area free of aliasing, for example when the subject conducts a cyclical movement in the region of interest (for example due to breathing). The knowledge about this cyclical movement or other subject-specific conditions can be used in order to determine the border, in particular its size. For example, 10% of the surface of the area or of the volume of the area can be added as a border (margin).

As mentioned above, it is particularly advantageous when additional parameters describing the field of view—in particular the position of the field of view in the slice plane and/or an extent of the field of view in the readout direction and/or an extent of the field of view in a partition direction—are also determined (in particular automatically) with the method according to the invention.

As indicated above, specifications of a measurement protocol, in particular limitations of parameters and/or definitely predetermined parameters, can also be taken into account to determine parameters describing the field of view. For example, the phase coding direction can already be predetermined by definition and only an extent of the field of view is determined. It is also sufficient for the phase coding direction (which is moreover sufficient by itself in order to define the other directions, thus the readout direction and if necessary the partition direction) may lie only in a specific angle range. Arbitrary measurement protocol specifications are thus conceivable.

The method according to the invention can also be advantageously applied in regard to a technique what is known as the "phase oversampling method". Phase oversampling means that a field of view is used that encompasses the entire subject so that there is no aliasing, with data outside of a narrower field of view being discarded after the acquisition. In the framework of the method according to the invention, image data exhibiting aliasing in the image exposure can be determined and discarded under consideration of the aliasing information. In such an embodiment, however, the method according to the invention is already advantageous from the outset, to the effect that the dimensions of the subject can be taken into account for determination of this expanded field of view, such that this can also be shrunk.

DESCRIPTION OF THE PREFERRED EMBODIMENTS

Figure 1:
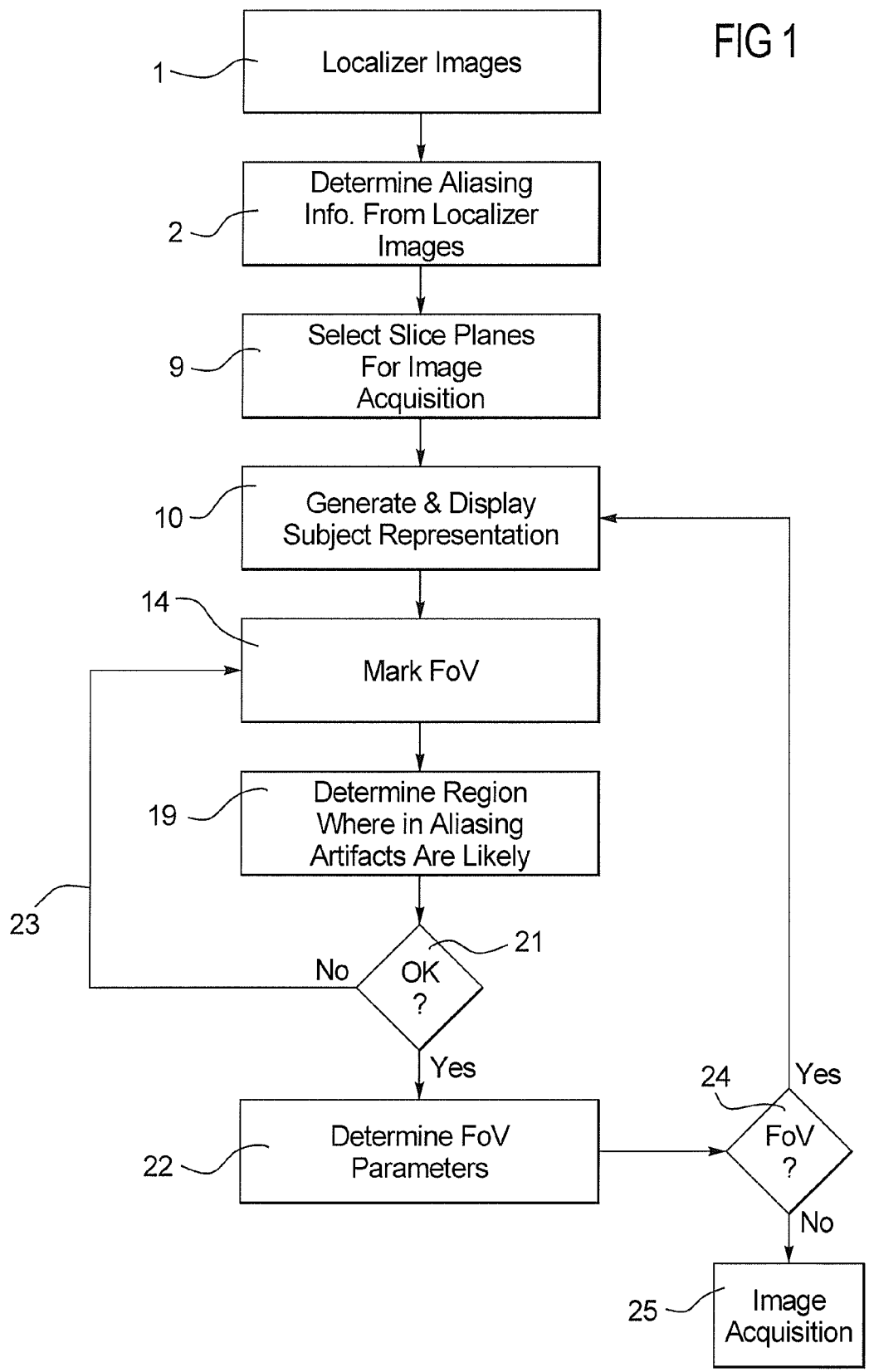
FIG. 1 is a flowchart of a first embodiment of the method according to the invention.

FIG. 1 shows a flowchart of a first embodiment of the method according to the invention. In a first step 1, a set of localizer exposures of a subject, which should later be the subject matter of an image acquisition with a magnetic resonance device, is initially generated, wherein in particular a region of interest should be acquired. Localizer exposures are already well known and do not need to be explained in detail herein.

In step 2 of the method according to the invention, aliasing information is determined from the localizer exposures. This information essentially reflects which dimensions the subject has and, correspondingly, how and where aliasing is to be expected. The aliasing information is thus subject-specific and is stored in the magnetic resonance device for the duration of the examination after its determination. In principle, two variants for the determination of said information are conceivable in the framework of the method according to the invention.

Figure 2:
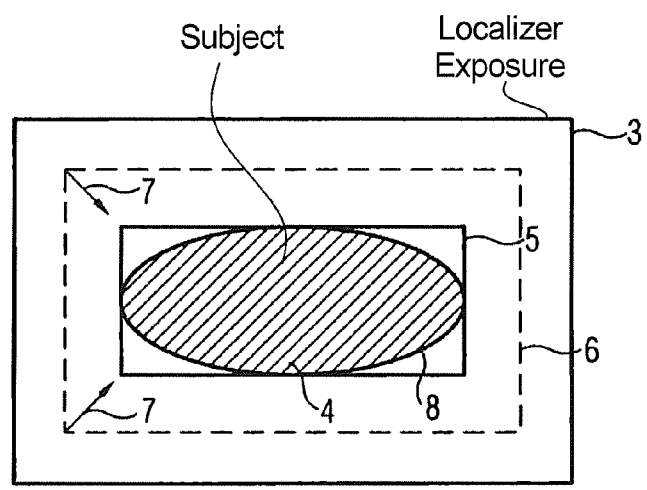
FIG. 2 illustrates the determination of a minimal geometric shape of the subject in accordance with the invention.

It can initially be provided that a minimal geometric shape that generally conforms to the subject is determined. This is schematically presented in FIG. 2. A localizer exposure 3 of a subject 4 is indicated there. The geometric shape in this example should be a rectangle 5 whose surface is minimized. This can be imagined such that a general rectangle 6 whose short side edge is aligned in the direction of a phase coding direction (predetermined in this exemplary embodiment) and running in the anterior-posterior direction is contracted (arrow 7) until it receives a smallest-possible area.

It is naturally also possible to directly determine the surface 8 of the subject 4 (for example by means of a segmentation method) for every localizer exposure 3. In particular in such an embodiment, it is appropriate to determine from this a three-dimensional model that completely describes the surface of the subject 4. In this exemplary embodiment, however, the use of a rectangle 5 as a geometric shape should additionally, initially be assumed.

In a step 9 (FIG. 1), the slice planes for the image acquisition are then selected. If the ultimate image exposure consists only of a single slice, a single slice plane is naturally also sufficient. The slice planes can be determined automatically or also manually, for example using a corresponding representation. The slice plane is initially the plane extending into infinity in which the field of view should ultimately be defined, wherein in this exemplary embodiment two-dimensional slice exposures should be exposed; the partition direction thus does not need to be paid attention to. The coordinate system in the plane (phase coding direction and readout direction), the position of the field of view in the plane as well as the corresponding dimensions are thus to be determined. In this first exemplary embodiment of the method according to the invention, this occurs manually, as should be presented in the following.

In a step 10, a representation of the subject is initially generated in the directly observed slice plane and is displayed to the user. This representation is based on the localizer exposures and has been generated by interpolation or after generation of a three-dimensional image data set from the localizer exposure. Such a representation 12 is exemplarily shown in FIG. 3, which shows the subject 4 with the surface 8, wherein a region of interest 13 is recognizable within the subject 4.

Figure 3:
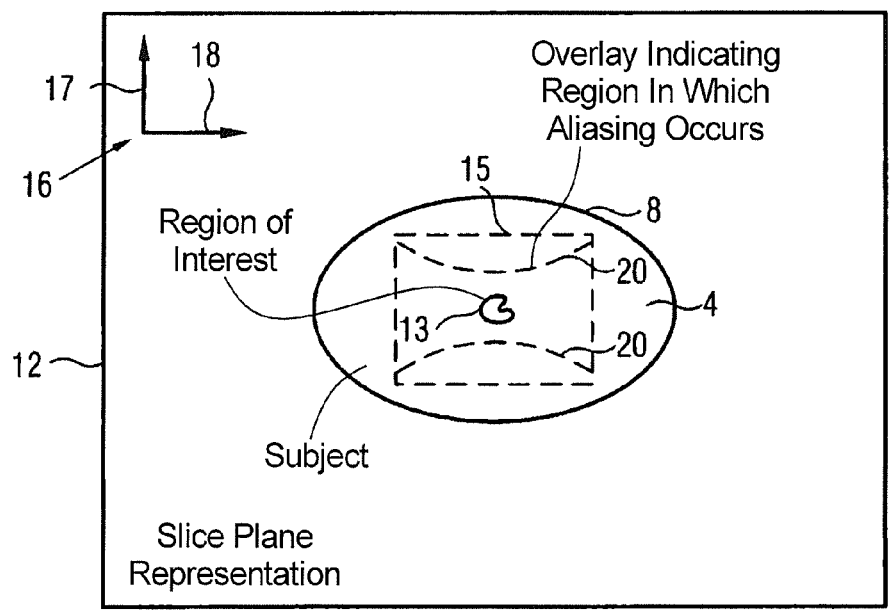
FIG. 3 shows a slice plane with masks, generated from the localizer exposures in accordance with the invention.

Within the representation 12, a user can now mark a possible field of view in a known manner in a step 14 (FIG. 1). This is represented in FIG. 3 by the boundary 15, wherein the coordinate system 16 indicates the phase coding direction 17 and the readout direction 18. The possible field of view clearly lies within the subject 4, thus does not completely encompass this (in particular in the phase coding direction 17), such that aliasing is to be expected.

Therefore, regions in which all aliasing artifacts will occur in all likelihood are now determined in a step 19 (FIG. 1) based on the determined aliasing information. These are then shown in the representation 12 as overlays 20 and thus are displayed to the user. However, a modified coloration of these overlays or the like is also possible.

Using these masks 20, the user can now decide whether the region of interest 13 and possibly a safety interval around this are clearly recognizable. If the user agrees with the previously selected possible field of view (which he decides in Step 21), the method is continued in Step 22 with the determination of the parameters describing the field of view. Naturally, however, the user can also define a new possible field of view (see arrow 23) in Step 14 if he is not satisfied.

In Step 22, the parameters describing the field of view that apply for this slice plane and with which the magnetic resonance device is controlled in the image acquisition are then determined from the corresponding marking 15. In Step 24 it is then checked whether a field of view is to be determined for additional slice planes. If "yes," the method proceeds with Step 10. An individual field of view is accordingly determined for each slice plane.

The corresponding image acquisition then ensues in Step 25. Since an optimized field of view was determined, this can be conducted quickly. However, it is also possible to convert the gain due to the smaller field of view into an improvement of the image quality, thus of the resolution or of the signal-to-noise ratio. This is also possible in Step 25.

Figure 4:
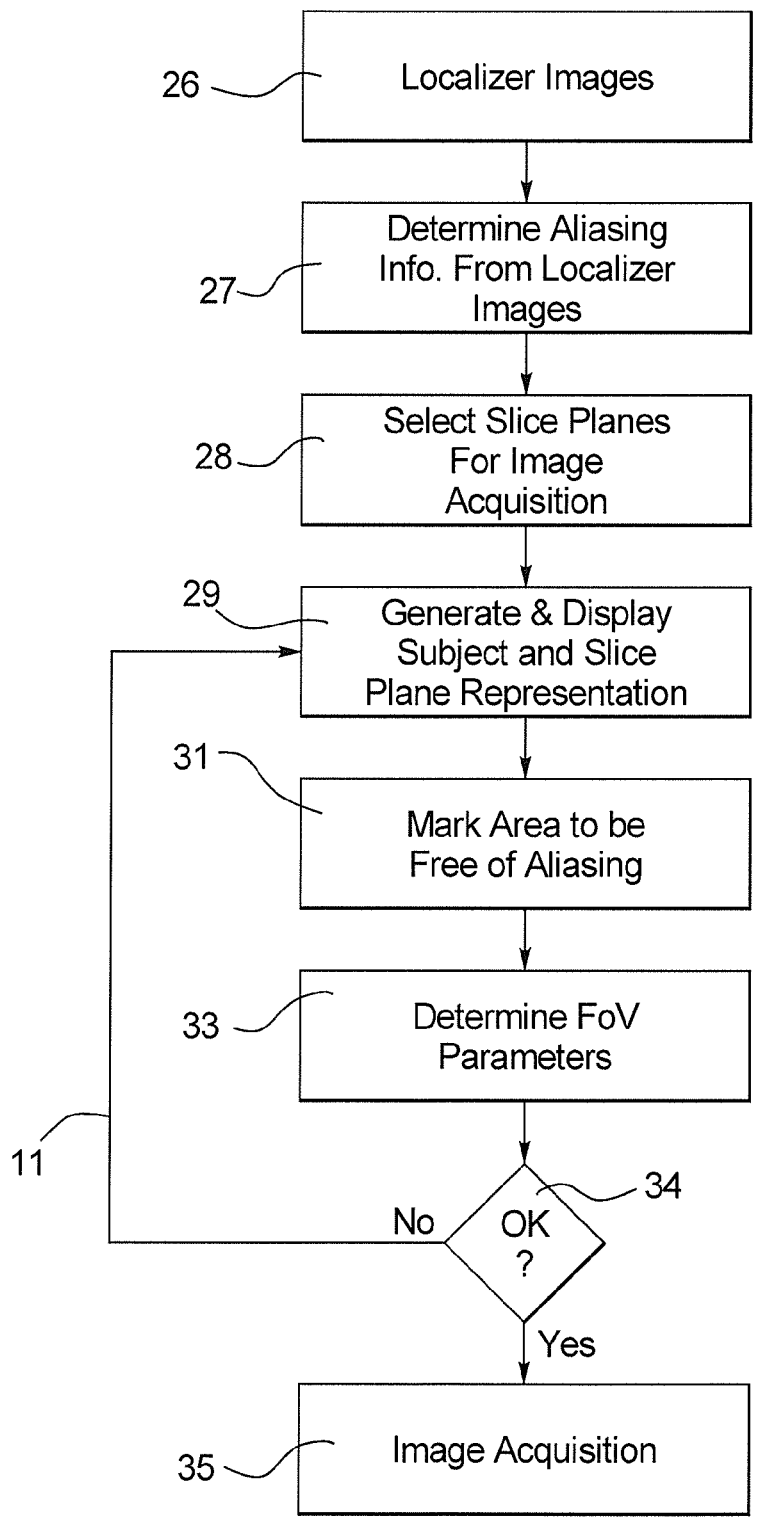
FIG. 4 is a flowchart of a second embodiment of the method according to the invention.
Figure 5:
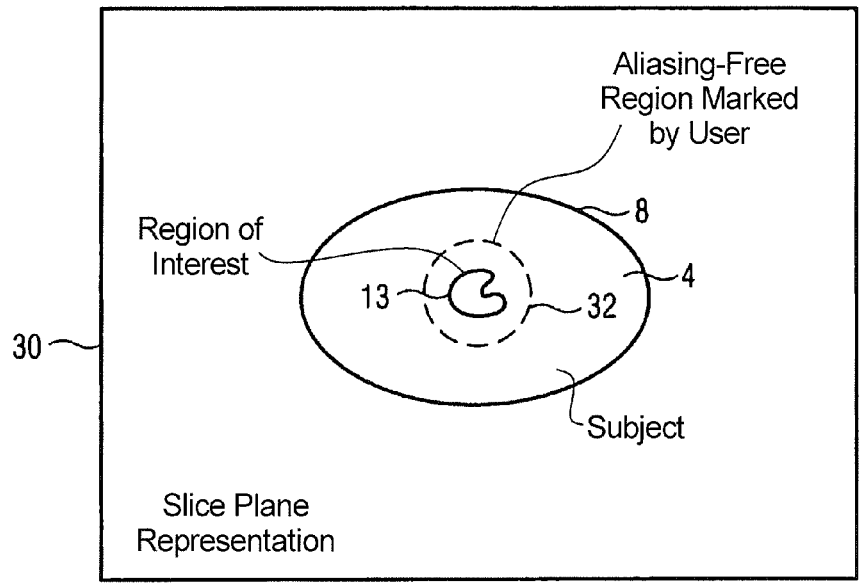
FIG. 5 shows a slice plane generated from the localizer exposures in accordance with the invention.

FIG. 4 shows an additional, second exemplary embodiment of the method according to the invention, wherein the determination of the field of view is implemented automatically using the definition of a desired, aliasing-free area. Steps 26, 27, 28 and 29 thereby correspond to Steps 1, 2, 9 and 10 of the first exemplary embodiment, meaning that aliasing information is also determined here from localizer exposures. The slice plane is or the slice planes are advantageously selected automatically, whereupon a representation of the slice plane (that is exemplarily marked with 30 in FIG. 5) is generated in Step 29. It shows the subject 4 with the surface 8 and the region of interest 13. A user now marks an area 32 in Step 31 (FIG. 4)—for example freehand or based on a suggestion automatically determined based on a segmentation and/or using an anatomical atlas—that encompasses the desired region 13 and which he desires to be free of aliasing. The field of view itself is thus no longer marked by the user; rather, the user must merely just indicate which region the user would like to acquire free of aliasing artifacts in the final image exposure.

At this point it is noted that, in addition to the semiautomatic or manual variants just described in Steps 29 and 31, it is likewise possible to determine the area 32 entirely automatically, for example from a specification of the region of interest ("heart examination"). However, even given such an automated determination it can be reasonable to display the result to a user for monitoring.

The parameters describing the field of view are then determined in Step 33 under consideration of the aliasing information from the area. Determinations or limitations of these parameters that are stored in a measurement protocol can also be employed.

In this case, it is concretely provided that the phase coding direction is initially determined using the shortest distance between two boundaries of the surface of the subject that include the area. The dimension can then be selected as the smallest along that direction in which "at least the subject" is present. The readout direction is also determined by the phase coding direction. The extent of the field of view in the phase coding direction is subsequently determined such that the area or the area and a predetermined border surrounding the area are free of aliasing. This is easily possible due to the known geometry of the subject and can, for example, also ensue in a minimization method. For example, the position of the field of view in the slice plane is thereby selected as the middle point or the focal point of the area or of the region of interest. The extent in the readout direction is determined using the corresponding boundaries of the area itself.

All parameters describing the field of view are automatically determined in this manner using the subject-specific aliasing information and the area. It is noted that in the method according to the invention it is also possible to automatically determine the parameters describing the field of view in another manner.

In Step 34 it is then checked whether the determination of the field of view must ensue for additional slice planes (arrow 11) or whether the image acquisition can ensue (Step 35).

Figure 6:
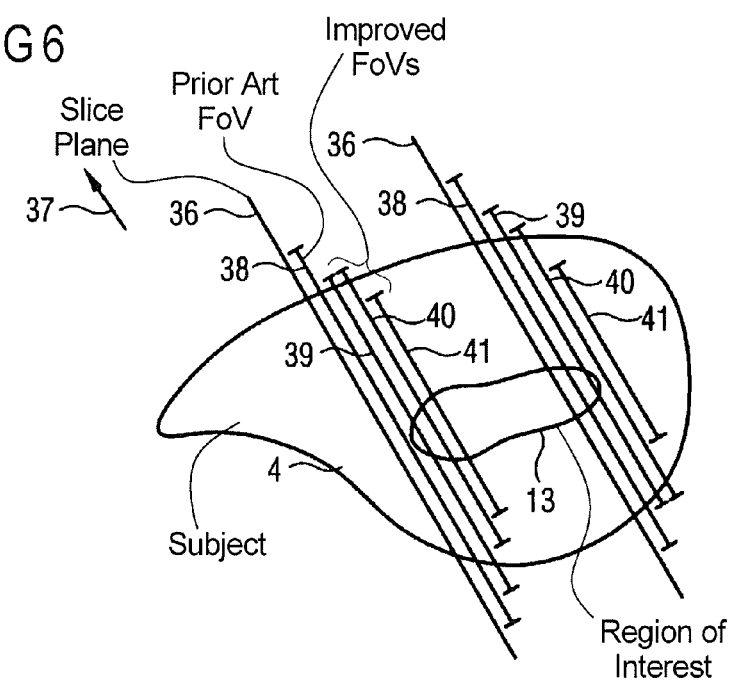
FIG. 6 is an illustration for determination of the field of view in accordance with the invention.

Using a simple, exemplary representation, FIG. 6 now shows how an optimized field of view is shrunk via the method according to the invention relative to the known methods. The subject 4, as well as the region of interest 13, two exemplarily presented slice planes 36, as well as the phase coding direction 37, are shown again. In the previously known methods, for safety the extent of the field of view in the phase coding direction is selected larger than the subject 4 itself, as is exemplarily shown by the extent 38. This can already be improved via the simplest embodiment of the method according to the invention, which determines the maximum extent of the subject 4 based on the aliasing information and uses dimensions 39 for all slice planes 36. The field of view can be selected even smaller when the dimensions of the subject 4 predetermine the extent in the phase coding direction 37 (extent 40) for every slice plane.

Even if aliasing is accepted, this relates to an aliasing-free area, as the user implicitly does this in the first exemplary embodiment according to FIG. 1 or as it is explicitly defined in the second exemplary embodiment according to FIG. 4, the extent in the phase coding direction 37 can additionally be significantly reduced as is shown by the dimensions 41. A shrinking of the field of view with the advantages following from this can clearly be achieved by using the subject-specific aliasing information with the method according to the invention.

It is noted that the concept of "phase oversampling" can also be applied to the method according to the invention in that image data possessing aliasing are determined and discarded in the image acquisition under consideration of the aliasing information.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for acquiring magnetic resonance image data from a region of interest of a subject in a magnetic resonance data acquisition device comprising, to establish a field of view from which said magnetic resonance image data will be obtained, the steps of:
   from a plurality of previously-acquired localizer magnetic resonance exposures of the subject that contain aliasing, automatically extracting aliasing information from each MR exposure selected from the group consisting of a minimal geometric shape encompassing the subject in each of said exposures and a boundary surface of the subject in each of said exposures;
   determining at least one slice plane from which diagnostic magnetic resonance image data will be acquired according to a measurement protocol; and
   in a processor, for each determined slice plane, determining at least one of a phase coding direction and an extent of the field of view in the phase coding direction using said extracted aliasing information; and
   supplying an electronic representation with respect to the determined phase coding direction or the extent of the filed of view, as an output from said processor, in a form for inclusion in said measurement protocol, in order to operate the magnetic resonance data acquisition device and acquire diagnostic magnetic resonance data.

2. A method as claimed in claim 1 comprising extracting said aliasing information based on a rectangle as said minimal geometric shape.

3. A method as claimed in claim 2 comprising minimizing an area of said rectangle to encompass said subject.

4. A method as claimed in claim 2 comprising predetermining said phase coding direction, and minimizing at least one side of said rectangle in said phase coding direction.

5. A method as claimed in claim 1 comprising extracting a minimal geometric shape encompassing said subject by determining a shape in said slice planes from defined shapes if the slice plane deviates from respective planes of said localizer exposures.

6. A method as claimed in claim 1 comprising determining said surface of said subject by image segmentation.

7. A method as claimed in claim 1 comprising determining a three-dimensional model describing the surface of the subject from surfaces determined from the localizer exposures.

8. A method as claimed in claim 1 comprising manually defining or deriving said at least one slice plane in at least one of said localizer exposures.

9. A method as claimed in claim 1 comprising defining said at least one slice plane automatically.

10. A method as claimed in claim 1 comprising selecting a measurement protocol that has a slice plane defined therein, and determining said at least one slice plane as the slice plane that is defined in said measurement protocol.

11. A method as claimed in claim 1 comprising manually marking a candidate field of view in at least one of said localizer exposures to define said phase coding direction or an extent of the field of view in the phase coding direction, and automatically determining aliasing that will occur in the marked field of view dependent on said aliasing information.

12. A method as claimed in claim 1 comprising designating a desired, aliasing-free area in at least one of said localizer images and automatically determining the phase coding direction, or an extent of the field of view in the phase coding direction, from said area dependent on said aliasing information.

13. A method as claimed in claim 12 comprising designating said aliasing-free area by a procedure selected from the group consisting of manual designation, semi-automatic designation, fully automatic designation, image segmentation, and using an anatomical atlas.

14. A method as claimed in claim 12 comprising determining said phase coding direction as a shortest distance between two boundaries of a geometrical shape of said area in said slice plane that includes said area.

15. A method as claimed in claim 12 comprising determining the extent of the field of view in the phase coding direction as a maximum distance between boundaries of a geometrical shape of the surface of the subject in the slice plane in the phase coding direction across one dimension in the readout direction.

16. A method as claimed in claim 12 comprising determining the extent of the field of view in the phase coding direction to cause the area and a predetermined margin surrounding said area to be free of aliasing.

17. A method as claimed in claim 16 comprising selecting said margin using subject-specific parameters.

18. A method as claimed in claim 17 comprising selecting said margin by cyclically moving said area.

19. A method as claimed in claim 1 comprising automatically determining additional parameters describing said field of view, selected from the group consisting of a position of the field of view in the slice plane, an extent of the field of view in a readout direction, and an extent of the field of view in a partition direction, and using said additional parameters in addition to said aliasing information for determining the phase coding direction or the extent of the field of view in the phase coding direction.

20. A method as claimed in claim 1 comprising establishing a measurement protocol for acquiring said magnetic resonance image data from the subject, and using specifications for said measurement protocol in addition to said aliasing information for determining said phase coding direction or the extent of the field of view in the phase coding direction.

21. A method as claimed in claim 1 comprising acquiring magnetic resonance image data that exhibit aliasing, and discarding said magnetic resonance image data exhibiting aliasing dependent on said aliasing information.

22. A method as claimed in claim 1 comprising determining a respective field of view for each slice plane if multiple slice planes are employed.

23. A method as claimed in claim 1 comprising adapting a resolution of an image reconstructed from said magnetic resonance image data using a size of said field of view.

* * * * *